(12) United States Patent
Tan et al.

(10) Patent No.: US 8,314,034 B2
(45) Date of Patent: Nov. 20, 2012

(54) FEATURE SIZE REDUCTION

(75) Inventors: Elliot N. Tan, Portland, OR (US);
Michael K. Harper, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/978,160

(22) Filed: Dec. 23, 2010

(65) Prior Publication Data

US 2012/0164837 A1    Jun. 28, 2012

(51) Int. Cl.
*H01L 21/302* (2006.01)

(52) U.S. Cl. ........ 438/717; 438/734; 438/736; 438/738; 257/E21.017; 257/E21.02

(58) Field of Classification Search .................. 438/427, 438/700, 717, 734, 736, 738; 257/E21.257, 257/E21.027, E21.017, E21.02, E21.582
See application file for complete search history.

(56) References Cited

U.S. PATENT DOCUMENTS

| | | | |
|---|---|---|---|
| 7,521,157 B2 | 4/2009 | Wallace | |
| 7,550,391 B2 * | 6/2009 | Jeon et al. | 438/717 |
| 7,569,310 B2 | 8/2009 | Wallace | |
| 7,572,557 B2 | 8/2009 | Wallace | |
| 7,601,647 B2 * | 10/2009 | Jeon et al. | 438/717 |
| 7,615,496 B2 * | 11/2009 | Lee et al. | 438/736 |
| 7,632,610 B2 | 12/2009 | Wallace | |
| 7,648,803 B2 | 1/2010 | Sivakumar | |
| 7,696,101 B2 * | 4/2010 | Li | 438/736 |
| 7,759,028 B2 | 7/2010 | Wallace | |
| 7,820,550 B2 | 10/2010 | Nyhus | |
| 7,915,171 B2 | 3/2011 | Wallace | |
| 2006/0000796 A1 | 1/2006 | Tan | |
| 2007/0026684 A1 * | 2/2007 | Parascandola et al. | 438/733 |
| 2008/0067550 A1 * | 3/2008 | Lee et al. | 257/207 |
| 2008/0200026 A1 * | 8/2008 | Koh et al. | 438/643 |
| 2009/0124084 A1 | 5/2009 | Tan | |
| 2009/0170316 A1 | 7/2009 | Tan | |
| 2009/0263751 A1 | 10/2009 | Sivakumar | |

OTHER PUBLICATIONS

Hara, A., et al, "Advanced Self-Aligned DP Process Development for 22-nm Node and Beyond," Advances in Resist Materials and Processing Technology XXVII, Proc. of SPIE, 2010, 76391T-1-7, vol. 7639.

Lin, B.J., "Immersion Lithography and its Impact on Semiconductor Manufacturing," J. Microlith., Microfab., Microsyst., SPIE, 2004, 377-394, vol. 3, No. 3.

* cited by examiner

*Primary Examiner* — Hsien Ming Lee
(74) *Attorney, Agent, or Firm* — Julia A. Hodge

(57) ABSTRACT

Methods for semiconductor device fabrication are provided. Features are created using spacers. Methods include creating a pattern comprised of at least two first features on the substrate surface, depositing a first conformal layer on the at least two first features, depositing a second conformal layer on the first conformal layer, partially removing the second conformal layer to partially expose the first conformal layer, and partially removing the first conformal layer from between the first features and the second conformal layer thereby creating at least two second features. Optionally the first conformal film is partially etched back before the second conformal film is deposited.

20 Claims, 4 Drawing Sheets

A

B

C

D

E

FEATURE SIZE REDUCTION

BACKGROUND OF THE INVENTION

1. Field of the Invention

The embodiments of the present invention relate generally to semiconductor processing and manufacture, integrated circuits, and spacers used to create devices in integrated circuits.

2. Background Information

The push for ever-smaller integrated circuits (IC) places enormous performance demands on the techniques and materials used to construct IC devices. In general, an integrated circuit chip is also known as a microchip, a silicon chip, or a chip. IC chips are found in a variety of common devices, such as the microprocessors in computers, cars, televisions, CD players, and cellular phones. A plurality of IC chips are typically built on a silicon wafer (a thin silicon disk, having a diameter, for example, of 300 mm) and after processing the wafer is diced apart to create individual chips. A 1 cm$^2$ IC chip having feature sizes around of about 65 nm can comprise hundreds of millions of components. Current technologies are pushing feature sizes even smaller than 45 nm.

DETAILED DESCRIPTION OF THE INVENTION

A variety of processes are used to fabricate the devices that make up an integrated circuit chip, such as, deposition processes that lay down materials, and lithographic and etching processes that remove materials in selected areas. The continued miniaturization of semiconductor chips requires the definition of features on the 45 nm scale and below. One common process used to create features is photo lithography (lithography). Lithography typically involves depositing a layer of photoresist on the wafer surface over the material to be patterned, patterning the photoresist with electromagnetic radiation (typically deep ultraviolet light), and removing the photoresist in patterned (or unpatterned, depending on the type of photoresist) areas. The layer beneath the photoresist that has been exposed is then etched in a typical process. Patterning the photoresist with electromagnetic radiation can be done for example, by exposing the photoresist through a mask. The pattern of the mask is then transferred to the photoresist. Techniques such as immersion and EUV (extreme ultraviolet) lithography allow even smaller features to be manufactured. However, resolution limits determined by the imaging wavelength and the numerical aperture of the optical system exist for optical lithographic techniques.

The substrate on which the devices that make up the IC circuit chip are built is, for example, a silicon wafer or a silicon-on-insulator substrate. Silicon wafers are substrates that are typically used in the semiconductor processing industry, although embodiments of the invention are not dependent on the type of substrate used. The substrate could also be comprised of, for example, germanium, indium antimonide, lead telluride, indium arsenide, indium phosphide, gallium arsenide, gallium antimonide, and or other Group III-V materials either alone or in combination with silicon or silicon dioxide or other insulating materials. IC devices that make up the chip are built on the substrate surface. Devices are optionally distributed across the substrate surface and or stacked on top of each other.

Embodiments of the present invention provide methods for patterning features on a substrate, such as a silicon wafer, with a tight pattern density. Spacers are used to create features having smaller pitches than are available by lithographic techniques while also minimizing the number of fabrication processes necessary to create the features. In general, the pitch of a feature is the distance between repeating feature units and includes a feature dimension (e.g., feature width) in the measurement.

Figure 1A:
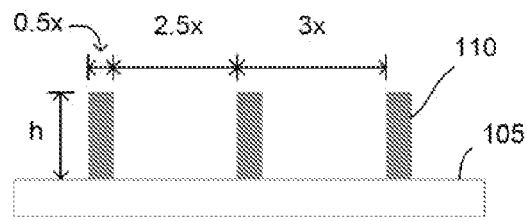
FIGS. 1A-1E show a process for creating features using dual spacers that is useful for integrated circuit device fabrication.

FIGS. 1A-E demonstrate a process for creating features using dual spacers. In general a spacer is a feature created during a device fabrication process that may be all or partially removed during the fabrication process. In FIG. 1A, a substrate 105 has first features 110. First features 110 are created on substrate 105 through a deposition, lithographic patterning, and etching processes, for example, by depositing a layer of material out of which the features will be made on a substrate surface, coating the material with a photoresist, lithographically patterning the photoresist, selectively removing the photoresist according to the pattern, and etching the material in the regions in which the photoresist has been removed, and removing the remaining photoresist. Features 110 comprise, for example silicon nitride (SiN). Using features 110 having a pitch of 3x (as in FIG. 1) results in a device that has features with a pitch of 1x. The width of the features 110 is 0.5x in FIG. 1. The initial edge-to-edge feature-to-feature 110 distance is 2.5x in FIG. 1. In embodiments of the invention, 1x is the final pitch to be achieved and 3x is the starting pitch patterned by lithography. In embodiments, x is a number between 5 nm and 30 nm. The height (h) of features 110 is typically in the range of 10 nm to 100 nm. So that, for example, a technique, such as EUV lithography, that provides features with a 60 nm pitch, can be used to make features with a 20 nm pitch and a technique, such as immersion lithography, that provides features at a 80 nm pitch, can be used to make features with a 27 nm pitch, according to embodiments of the invention. The width of the features 110 (0.5x in FIG. 1A), and the features to be created is, in this embodiment, in a ratio of 1:5 with the distance between features (2.5x in FIG. 1A). In the embodiment shown in FIGS. 1A-E, the features are shown as a grating for simplicity, however, the geometry, placement, and number of the features is not limited to the geometry, placement, and number of the features shown in this embodiment. Other geometries, placements, and numbers of feature(s) that allow semiconductor devices to be fabricated are possible.

Figure 1B:
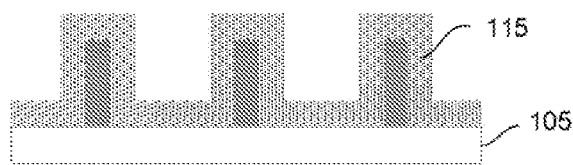
Figure 1C:
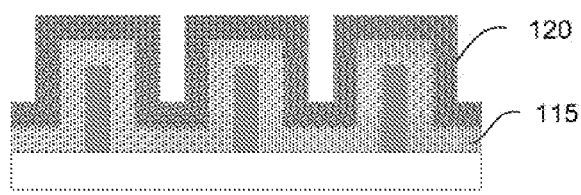
Figure 1D:
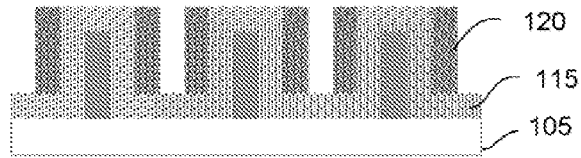

In FIG. 1B, a first conformal spacer film 115 has been deposited on features 110 and the surface of substrate 105. The conformal spacer film 115 has a thickness of 0.5x in this embodiment. The first conformal spacer film 115 is comprised, for example, of amorphous carbon and can be deposited using, for example, chemical vapor deposition. In FIG. 1C a second conformal spacer film 120 has been deposited and covers the first conformal spacer film 115. The second conformal spacer film 120 has a thickness of 0.5x in this embodiment. The second conformal spacer film 120 is comprised, for example, of silicon nitride and can be deposited using, for example, chemical vapor deposition or atomic layer deposition. In FIG. 1D the second conformal spacer film is partially etched back uncovering the first conformal spacer film 115. Etching is accomplished, for example, using reactive ion plasma.

Figure 1E:
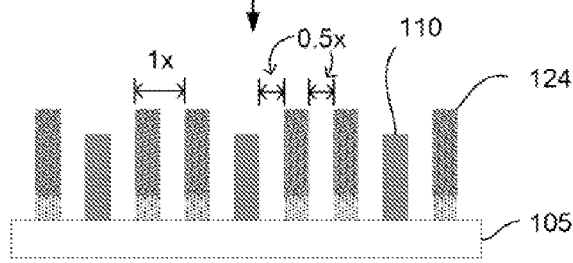

In FIG. 1E, the first conformal spacer film 115 is selectively etched away creating features 124 that are comprised, in part, of the second conformal spacer film 120. Etching is accomplished, for example, using a dry etch with a reactive ion plasma, and in the case of amorphous carbon 115, an oxygen plasma. The resulting features 110 and 124 have a pitch of 1x, a width of 0.5x, and an edge-to-edge feature distance of 0.5x. According to embodiments of the invention, a set of features having a 30 nm pitch can be created using a starting grating having a pitch of 90 nm and a set of features having a 20 nm pitch can be created using a starting grating having a pitch of 60 nm. Embodiments of the invention advantageously allow feature size reduction while also using a relatively small number of process steps.

Figures 2A, 2B, 2C, 2D, 2E, 2F:
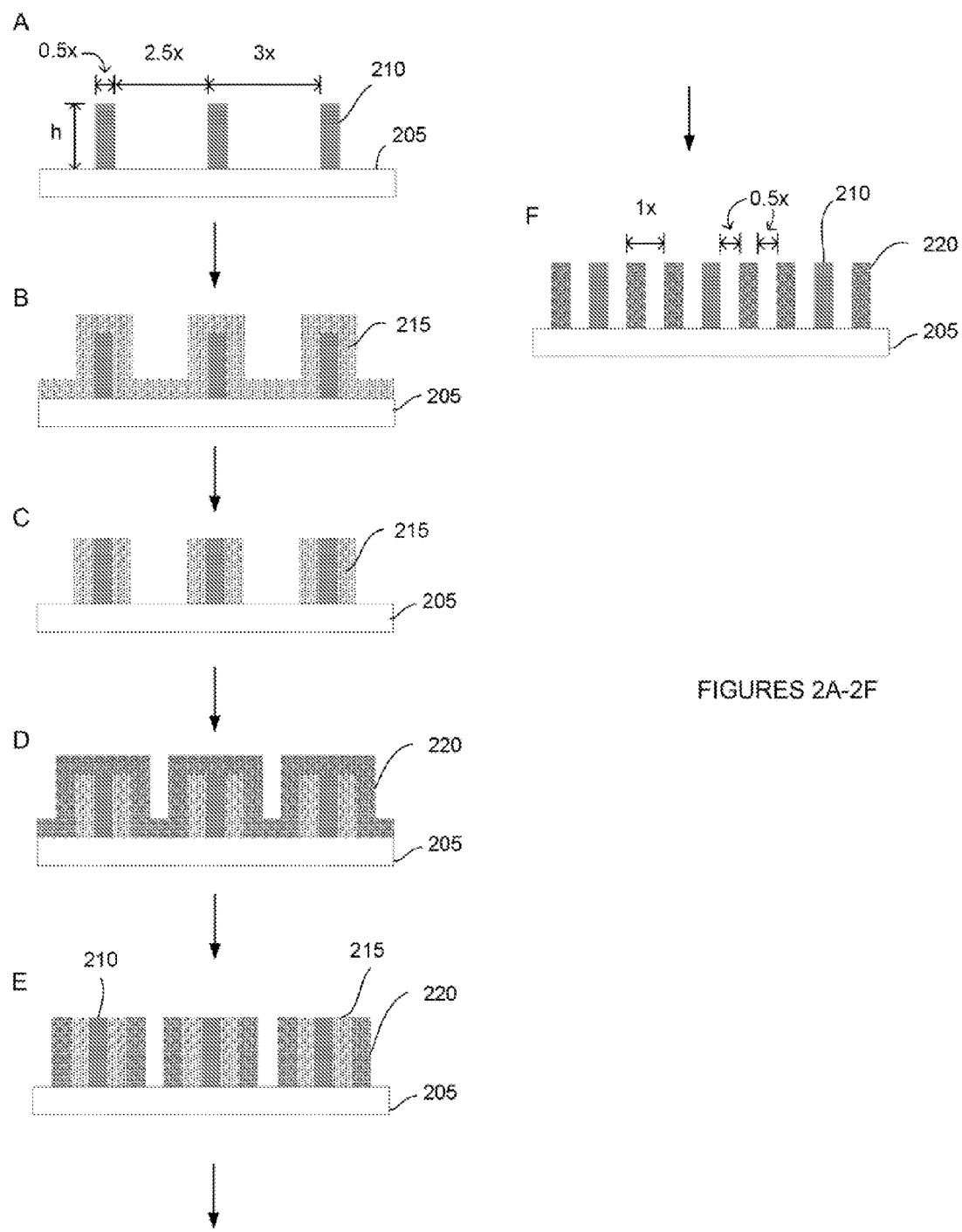
FIGS. 2A-2F illustrate an additional process for creating features using dual spacers that is useful for integrated circuit device fabrication.

FIGS. 2A-2F demonstrate an additional process for creating features using semiconductor processing techniques and spacers. In FIG. 2A, a substrate 205 has first features 210. First features 210 are created on substrate 205 through a deposition, lithographic patterning, and etching process, for example, by depositing a layer of material out of which the features will be made on a substrate surface, coating the material with a photoresist, lithographically patterning the photoresist, selectively removing the photoresist according to the pattern, and etching the material in the regions in which the photoresist has been removed, and removing the remaining photoresist and first features 210 comprise, for example silicon nitride. Using features 210 having a pitch of 3x results in a device that has features with a pitch of 1x. The width of the features 210 is 0.5x. The edge-to-edge feature distance is 2.5x in FIG. 2. In embodiments of the invention, x is a number between 5 nm and 30 nm. The height (h) of features 210 is typically in the range of 10 nm to 100 nm. The width of the features 210 (0.5x in FIG. 2A), and the features to be created is, in this embodiment, in a ratio of 1:5 with the distance between features (2.5x in FIG. 2A). In the embodiment shown in FIGS. 2A-2E, the features are shown as a grating for simplicity, however, the geometry, placement, and number of the features is not limited to the geometry, placement, and number of the features shown in this embodiment. Other sizes, geometries, placements, relative orientations, and numbers of feature(s) that allow semiconductor devices to be fabricated are possible.

In FIG. 2B, a first conformal spacer film 215 covers features 210 and the surface of substrate 205. The first conformal spacer film 215 has a thickness of 0.5x in this embodiment. The first conformal spacer film 215 is comprised, for example, of silicon oxide and can be deposited using, for example, chemical vapor deposition or atomic layer deposition. In FIG. 2C, the first conformal spacer film 215 has been partially etched back partially exposing the substrate and partially exposing features 210. The etching to create the device of FIG. 2C from the device of FIG. 2B is accomplished, for example, by reactive ion plasma.

In FIG. 2D a second conformal spacer film 220 has been deposited and covers the first conformal spacer film 215. The second conformal film 220 has a thickness of 0.5x in this embodiment. The second conformal film 220 is comprised, for example, of amorphous carbon and can be deposited using, for example, chemical vapor deposition or atomic layer deposition. In FIG. 2E the second conformal film 220 is partially etched back partially uncovering the first conformal spacer film 115 and partially uncovering the surface of the substrate 205. Partial etching is accomplished, for example, using reactive ion plasma.

In FIG. 2F the first conformal spacer film 215 is removed revealing features 210 and 220. The first conformal spacer film 215 of silicon oxide is removed, for example, through wet etching using aqueous HF. The resulting features 210 and 220 have a pitch of 1x, a width of 0.5x, and an edge-to-edge feature distance of 0.5x.

Figures 3A, 3B, 3C:
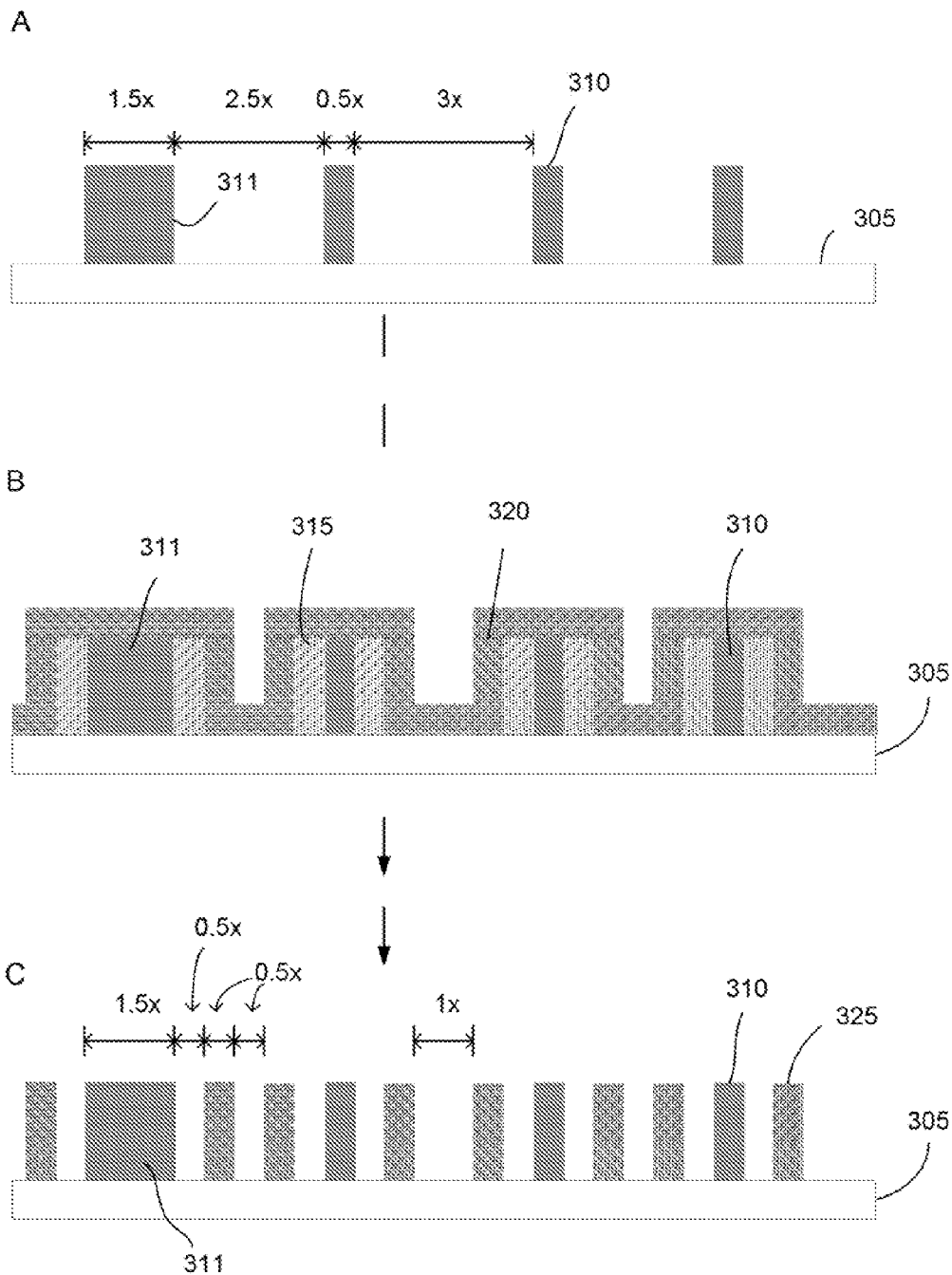
FIGS. 3A-3C provide a further process that creates variable line-space features using dual spacers that is useful for integrated circuit device fabrication.

FIGS. 3A-3C illustrate a process for semiconductor device feature fabrication in which the pitch of the resulting features is varied. The embodiments shown in FIGS. 3A-3C are used, for example, with the methods of FIGS. 1A-E and 2A-2F. It is also possible to combine elements of FIGS. 3A-3C with FIGS. 4A-4C. In FIG. 3A, substrate 305 has first features 310 and 311. In the embodiment of FIGS. 3A-3C, feature size is varied by varying the size of the first features 310 and 311, and as can be seen, first feature 310 has a width of 0.5x and first feature 311 has a width that is 1.5x. First features having other widths are also possible and the selection of specific values depends, for example, on the type of device being manufactured. Similarly, the edge-to-edge distances between first features 310 and 311 are varied and distances of 2.5x and 3x are shown in FIG. 3A. Other edge-to-edge feature distances are also possible and the selection of specific values depends, for example, on the type of device being manufactured. In FIG. 3B, an embodiment in which the first conformal film 315 has been etched back (according to the embodiments of FIGS. 2A-2F) is shown, but as previously mentioned, it is also possible to not etch back the first conformal film 315 (according to the embodiments of FIGS. 1A-1E). A second conformal film 320 has been deposited and covers features 310 and 311 and what remains of first conformal film 315. After the second conformal film 320 has been partially etched back and the first conformal film etched from between the first features 310 and 311, the device of FIG. 3C is obtained. As can be seen in FIG. 3C, features 310, 311, and 325 have sizes that are 1.5x and 0.5x. Edge-to-edge distances between features 310, 311, and 325 vary between 0.5x and 1x. The pattern created by features 310, 311, and 325 can optionally be etched into the substrate 305 using features 310, 311, and 325 as a mask. The features 310, 311, and 325 are optionally removed after the substrate is etched.

Figures 4A, 4B, 4C:
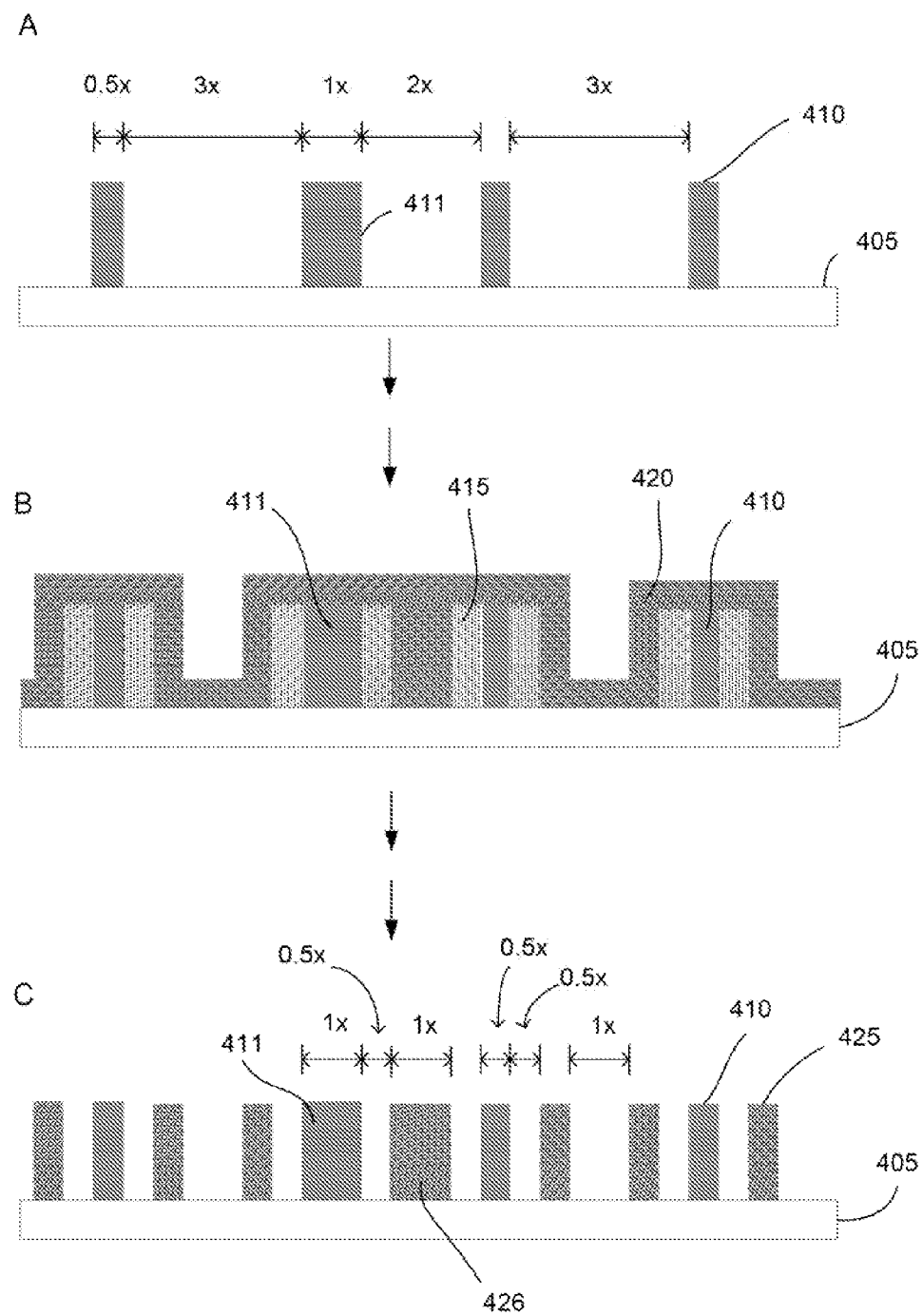
FIGS. 4A-4C show an additional process that creates variable line-space features using dual spacers that is useful for integrated circuit device fabrication.

FIGS. 4A-4C show a process for semiconductor device feature fabrication in which the pitch of the resulting features is varied. The embodiment shown in FIGS. 4A-4C is used, for example, with the methods of FIGS. 1A-1E and 2A-2F. It is also possible to combine elements of FIGS. 4A-4C with FIGS. 3A-3C. In FIG. 4A, substrate 405 has first features 410 and 411. In the embodiment of FIGS. 3A-3C, feature size is varied by varying the size of the first features 410 and 411, and as can be seen, first feature 410 has a width of 0.5x and first feature 411 has a width that is 1x. First features 410 and 411 having other widths are also possible and the selection of specific values depends, for example, on the type of device being manufactured. Similarly, the edge-to-edge distances between first features 410 and 411 are varied and distances of 2x and 3x are shown in FIG. 4A. Other edge-to-edge feature distances are also possible and the selection of specific values depends, for example, on the type of device being manufactured. In FIG. 4B, an embodiment in which the first conformal film 415 has been etched back (according to the embodiments of FIGS. 2A-2F) is shown, but as previously mentioned, it is also possible to not etch back the first conformal film 415 (according to the embodiments of FIGS. 1A-1E). A second conformal film 420 has been deposited and covers features 410 and 411 and what remains of first conformal film 415, and fills a gap between two first features 410 and 411. After the second conformal film 420 has been partially etched back exposing first conformal film 415, and the first conformal film etched from between the first features 410 and 411, the device of FIG. 4C is obtained. As can be see in FIG. 4C, features 410 and 425 have sizes that are 0.5x and features 411 and 426 have sizes that are 1x. Edge-to-edge distances between features 410, 411, 425, and 426 vary between 0.5x and 1x. The pattern created by features 410, 411, 425 and 426 can optionally be etched into the substrate 305 using features 410, 411, 425 and 426 as a mask. The features 410, 411, 425 and 426 are optionally removed after the substrate is etched.

Optionally, according to embodiments of the invention, the features created by the disclosed methods can be used as a mask to transfer the feature into the substrate below. In an embodiment, the substrate surface upon which the features are disposed is silicon, and the features are transferred into the surface of the silicon substrate using, for example, a dry etch. The features are then optionally removed, using for example, a wet etch.

Further optionally, a hard mask is used to facilitate the transfer of features created by the disclosed methods into the substrate below. In embodiments in which a hard mask is used, the substrate is provided with a hard mask before the first features (i.e., 110, 210, 310, 311, 410, and 411) are fabricated on the substrate, so that the hard mask is between the substrate and the first features and conformal spacer films. In these embodiments, the pattern created is transferred to the hard mask (i.e., the hard mask is etched in exposed regions), the features are removed, and the exposed substrate is etched creating features in the substrate.

It is, of course, possible to use other materials as first features and first and second conformal spacers. In general, materials are selected so that an etch chemistry is able to discriminate between the backbone (i.e., first features, 110, 210, 310, 311, 410, and 411) and the second spacer film (i.e., 120, 220, 320, and 420), so that the first spacer film can be selectively etched away leaving the first and second (spacer) features. Table 1 provides additional exemplary materials that can be used in embodiments of the invention as described with respect to FIGS. 1-4, for example. In Table 1, SiN is silicon nitride, a-C is amorphous carbon, PLY-Si is polycrystalline silicon, a-Si is amorphous silicon, SiO is silicon dioxide, TiN is titanium nitride, and CHM is a carbon hard mask.

TABLE 1

| Option: | 1 | 2 | 3 | 4 | 5 | 6 |
|---|---|---|---|---|---|---|
| First Feature: | SiN | PLY-Si | PLY-Si | SiO | SiO | SiO |
| First Spacer: | a-C | a-C | SiO | a-C | a-Si | a-Si |
| Second Spacer | SiN | a-Si | a-Si | SiO | SiO | SiO |
| Hard Mask | — | SiN | SiN | TiN | TiN | CHM |

According to Table 1, an option, such as Option 3 involves using polysilicon for the first feature, silicon dioxide for the first spacer, and amorphous silicon for the second feature. An optional hard mask is comprised of silicon nitride.

Persons skilled in the relevant art appreciate that modifications and variations are possible throughout the disclosure and combinations and substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics may be combined in any suitable manner in one or more embodiments. Various additional layers and/or structures may be included and/or described features may be omitted in other embodiments.

We claim:

1. A method for forming features on a substrate comprising, providing a substrate having a surface, creating a first and a second feature on the substrate surface wherein the first and the second feature are proximate to each other, depositing a first conformal layer on the first and second features, depositing a second conformal layer on the first conformal layer, partially removing the second conformal layer to partially expose the first conformal layer, and partially removing the first conformal layer from between the first feature and the second conformal layer and from between the second feature and the second conformal layer thereby creating a third and fourth separated feature between the first and the second features.

2. The method of claim 1 wherein the first and the second features have an edge-to-edge distance between features of 2.5x, wherein the third and fourth features have an edge-to-edge distance between features of 0.5x, wherein the third feature and the first feature have an edge-to-edge distance between features of 0.5x, and wherein x is a value between and including 5 nm to 30 nm.

3. The method of claim 1 wherein the first and second features are comprised of a material selected from the group consisting of silicon nitride, polycrystalline silicon, and silicon dioxide.

4. The method of claim 2 wherein the first feature has a width of 0.5x.

5. The method of claim 1 wherein the first conformal layer is comprised of amorphous carbon or silicon dioxide.

6. The method of claim 1 wherein the second conformal layer is comprised of a material selected from the group consisting of silicon nitride, amorphous silicon, and silicon dioxide.

7. The method of claim 1 wherein the substrate is a semiconductor substrate.

8. The method of claim 1 wherein the method additionally includes etching a pattern into the substrate defined by the first and second features.

9. The method of claim 8 wherein the substrate additionally comprises a hard mask layer between the first features and the substrate.

10. The method of claims 8 or 9 additionally including removing the first and second features from the substrate after the pattern has been etched into the substrate.

11. A method for forming features on a substrate comprising, providing a substrate having a surface, creating a first and a second feature on the substrate surface wherein the first and the second feature are proximate to each other, depositing a first conformal layer on the first and second features, partially removing the first conformal layer to partially expose the first and second features, depositing a second conformal layer on the exposed surfaces of the first and second features and the first conformal layer, partially removing the second conformal layer to partially expose the first conformal layer, and removing the first conformal layer from between the first feature and the second conformal layer and from between the second feature and the second conformal layer thereby creating a third and fourth separated feature between the first and the second features.

12. The method of claim 11 wherein the first and the second features have an edge-to-edge distance between features of 2.5x, wherein the the third and fourth features have an edge-to-edge distance between features of 0.5x, wherein the third feature and the first feature have an edge-to-edge distance between features of 0.5x, and wherein x is a value between and including 5 nm to 30 nm.

13. The method of claim 12 wherein a first feature has a width of 0.5x.

14. The method of claim 12 wherein the first and second features are comprised of a material selected from the group consisting of silicon nitride, polycrystalline silicon, and silicon dioxide.

15. The method of claim 12 wherein the first conformal layer is comprised of amorphous carbon or silicon dioxide.

16. The method of claim 12 wherein the second conformal layer is comprised of a material selected from the group consisting of silicon nitride, amorphous silicon, and silicon dioxide.

17. The method of claim 12 wherein the substrate is a semiconductor substrate.

18. The method of claim 12 wherein the method additionally includes etching a pattern into the substrate defined by the first and second features.

19. The method of claim 18 wherein the substrate additionally comprises a hard mask layer between the first and second features and the substrate.

20. The method of claim 18 or 19 additionally including removing the first and second features from the substrate after the pattern has been etched into the substrate.

* * * * *